(12) United States Patent
Mizuta et al.

(10) Patent No.: US 6,452,754 B1
(45) Date of Patent: Sep. 17, 2002

(54) FLEXIBLE PRINTED CIRCUIT BOARD ATTACHMENT STRUCTURE AND RECORDING AND REPRODUCING DEVICE USING THE SAME

(75) Inventors: Koji Mizuta; Takashi Nakai, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/322,567

(22) Filed: May 28, 1999

(30) Foreign Application Priority Data

Jun. 8, 1998 (JP) .......................... 10-158845
Feb. 8, 1999 (JP) .......................... 11-029743

(51) Int. Cl.⁷ .............................. G11B 5/55; H01B 7/04
(52) U.S. Cl. ............................... 360/266.3; 174/117 FF
(58) Field of Search ....................... 360/266.3; 439/82, 439/67, 77; 174/117 F, 117 FF

(56) References Cited

U.S. PATENT DOCUMENTS 5,648,883 A    7/1997  Sampei et al. .............. 360/106

FOREIGN PATENT DOCUMENTS

GB          2154077   *  8/1985
JP          63-72712     5/1988

\* cited by examiner

*Primary Examiner*—George J. Letscher
(74) *Attorney, Agent, or Firm*—Brinks Hofer Gilson & Lione

(57) ABSTRACT

In a flexible printed circuit board, a terminal formation portion has a base portion extending a connection portion with a circuit pattern from an end, and a bend portion, bent along a bending line in a direction of insertion into an attachment hole of a printed circuit board, from the base portion, such that terminals are exposed outside. The flexible printed circuit board is attached to the printed circuit board by inserting the bend portion and the base portion into the attachment hole of the printed circuit board.

9 Claims, 9 Drawing Sheets

FLEXIBLE PRINTED CIRCUIT BOARD ATTACHMENT STRUCTURE AND RECORDING AND REPRODUCING DEVICE USING THE SAME

BACKGROUND OF THE INVENTION

The present invention relates to a flexible printed circuit board (hereinafter abbreviated to "FPC") attachment structure for signal transmission to a recording head in a recording and reproducing device using a recording/reproducing disk such as a floppy disk or a hard disk, and the recording and reproducing device using the structure.

A recording and reproducing device using a conventional flexible printed circuit board (FPC) attachment structure will be described in accordance with a magnetic recording and reproducing device disclosed in Japanese Unexamined Utility Model Publication No. Sho 63-72712. As shown in FIG. 14, as a part of the structure of the magnetic recording and reproducing device, a head support arm 11 is attached to a carriage 8 and a head attachment base 8a of the carriage 8 via a plate spring 12. The head support arm 11 is elastically biased so as to be rotatable upward and downward.

A pair of opposed recording heads 6 and 7, respectively comprising a magnetic head, are attached to the end of the head attachment base 8a and that of the head support arm 11. The recording heads 6 and 7 are elastically brought into contact with front and rear surfaces of a recording disk 10 comprising a floppy disk, represented by an alternate long and short dashed line, and the carriage 8, guided by a guide shaft 15, reciprocates in arrow A directions along a radial direction of the recording disk 10.

Then, while the recording disk 10 is rotated at a high speed, the recording heads 6 and 7 are moved in the arrow A directions, to record/reproduce or erase information with respect to the front and rear surfaces of the recording disk 10.

In the recording and reproducing device of this type, the recording heads 6 and 7 are connected to ends of FPC's 21 and 22, and the other ends of the FPC's 21 and 22 are connected to a circuit pattern (not shown) of a printed circuit board 23 via connectors 24.

As shown in FIG. 15, in an attachment structure for the conventional FPC's 21 and 22 as described above, the connectors 24 previously attached to the printed circuit board 23 are projected from a through hole 25a of a chassis 25 of the recording and reproducing device.

On the other hand, the other ends of the FPC's 21 and 22, opposite to the ends connected to the recording heads 6 and 7, are guided to the outside from the head attachment base 8a and the head support arm 11. In these end portions, the FPC's 21 and 22 have terminals 21a and 22a such that terminals 21a are exposed on one surface of the FPC 21 while the terminals 22a are exposed on one surface of the FPC 22.

Electrical conduction is made between the recording heads 6 and 7, and the wiring pattern (not shown) of the printed circuit board 23, by inserting the ends of the FPC's 21 and 22 having the terminals 21a and 22a into connecting portions 24a of the connectors 24 having a plurality of contacts.

Note that reinforcing plates 26 as shown in FIG. 15 are attached to rear surfaces of the FPC's 21 and 22 at the portions of the terminals 21a and 22a, to increase the strength of the terminals 21a and 22a and neighboring parts of the FPC's 21 and 22, such that the FPC's 21 and 22 do not break even if the carriage 8 is reciprocated in the arrow A directions at a high speed.

Further, as the reinforcing plates 26 are attached to the portions of the terminals 21a and 22a, the thickness of the FPC's 21 and 22 at the terminals 21a and 22a is about 0.3 mm, which ensures connection between the terminals 21a and 22a and the connecting portions 24a of the connectors 24 when the terminals 21a and 22a are inserted into the connecting portions 24a of the connectors 24.

Further, in another conventional FPC attachment structure, as shown in FIG. 16, an attachment surface 21b (22b) of the FPC 21 (22) is attached to an inner side surface 27a (27b) of an approximately turned square U-shaped auxiliary member 27 by adhesive or the like, and the auxiliary member 27 is mounted on the printed circuit board 23. The terminals 21a (22a) projected downward are directly inserted into an attachment hole 23a of the printed circuit board 23 and attached thereto by solder or the like.

In this manner, in the conventional FPC attachment structure for the FPC's 21 and 22, the reinforcing plates 26 or auxiliary member 27 reinforces the thin-plate flexible FPC's 21 and 22, and the FPC's are directly attached, or attached via the connectors 24, to the printed circuit board 23. Accordingly, even if the carriage 8 is reciprocated along the arrow A directions, the FPC's 21 and 22 do not fall, or the terminal portions 21a and 22a directly attached to the printed circuit board 23 do not cause conduction failure. Thus, high reliability can be attained.

However, in the above-described conventional FPC attachment structures for the FPC's 21 and 22, as the FPC's 21 and 22 are reinforced by the reinforcing plates 26 or the auxiliary member 27, the number of parts increases, thus increasing the cost of manufacture.

Further, in the recording and reproducing device using the conventional FPC attachment structure as above-described structures for the FPC's 21 and 22, the number of assembling steps must be increased for attaching the reinforcing plates 26 or auxiliary member 27 to the FPC's. Assembly operability is therefore degraded and manufacture, thus productivity is lowered.

SUMMARY OF THE INVENTION

The present invention has its object to solve the above problems and to provide an FPC attachment structure which increases strength with a reduced number of parts and without any specific reinforcing member, and a recording and reproducing device using the structure.

Accordingly, as a first solution to these problems, the present invention provides a flexible printed circuit board attachment structure comprising: a printed circuit board having an attachment hole; and a flexible printed circuit board having a terminal formation portion where terminals are exposed at an end of one surface, and a connection portion where a circuit pattern is extended from the terminal formation portion to a signal transmission side, wherein the terminal formation portion has a base portion extending the connection portion to the signal transmitting side, and a bend base portion and a bend portion, bent from the base portion, along a bending line in a direction of insertion into the attachment hole of the printed circuit board, such that the terminals are exposed outside, and wherein the bend portion and the base portion are inserted into and attached to the attachment hole.

Further, as a second solution to these problems, in the above structure, the terminals are exposed on an outer surface of the base portion and the bend portion.

Further, as a third solution to these problems, in the above structure, the base portion is a terminal formation region where the terminals are, and the bend portion is a terminal non-formation region where the terminals are not formed.

Further, as a fourth solution to these problems, in the above structure, the attachment hole is formed so as to have a T shape comprising a long hole and a short hole, and in the base portion or the bend portion, a narrow width portion is formed by providing a notch in the bend base portion and in an end surface on a side opposite to the bend base portion, further, the narrow width portion is inserted into the short hole.

Further, as a fifth solution to these problems, in the above structure, the attachment hole is formed such that a side where the bend base portion is positioned has a narrow width, while a side where an end surface on a side opposite to the bend base portion is positioned has a wide width.

Further, as a sixth solution to these problems, in the above structure, the bend portion and the base portion are attached to each other by adhesive, and wherein the terminals are brought into contact with an inner surface of one side of the attachment hole and attached to the inner surface.

Further, as a seventh solution to these problems, the present invention provides a flexible printed circuit board attachment structure comprising: a flexible printed circuit board having a terminal formation portion where terminals are exposed, at an end of one surface, and a connection portion where a circuit pattern is extended from the terminal formation portion to a signal transmission side; a connector that connects the terminals to a connecting portion by inserting the terminals into the connecting portion; and a printed circuit board to which the connector is attached, wherein the terminal formation portion has a base portion extending the connection portion to the signal transmission side, and a bend portion bent from the base portion such that the terminals are exposed outside, and wherein the bend portion and the base portion, attached to each other with adhesive, are inserted into the connection portion of the connector.

Further, as an eighth solution to these problems, in the above structure, the bend portion is bent along a bending line in a direction of insertion into the connecting portion of the connector.

Further, as a ninth solution to these problems, in the above structure, the bend portion is bent along a bending line in a direction orthogonal to a direction of insertion into the connecting portion of the connector.

Further, as a tenth solution to these problems, the present invention provides a recording and reproducing device using the flexible printed circuit board attachment structure.

Further, as an eleventh solution to these problems, the recording and reproducing device further comprises a recording head that performs recording/reproducing and the like with respect to a recording disk, and the flexible printed circuit board is connected to the recording head.

Further, as a twelfth solution to these problems, in the recording and reproducing device, the terminal formation portion of the flexible printed circuit board is provided in parallel to a moving direction of the recording head.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

A flexible printed circuit board (FPC) attachment structure and a recording and reproducing device (hereinafter referred to as a "device") using the structure will be described in accordance with the accompanying drawings.

Figure 1:
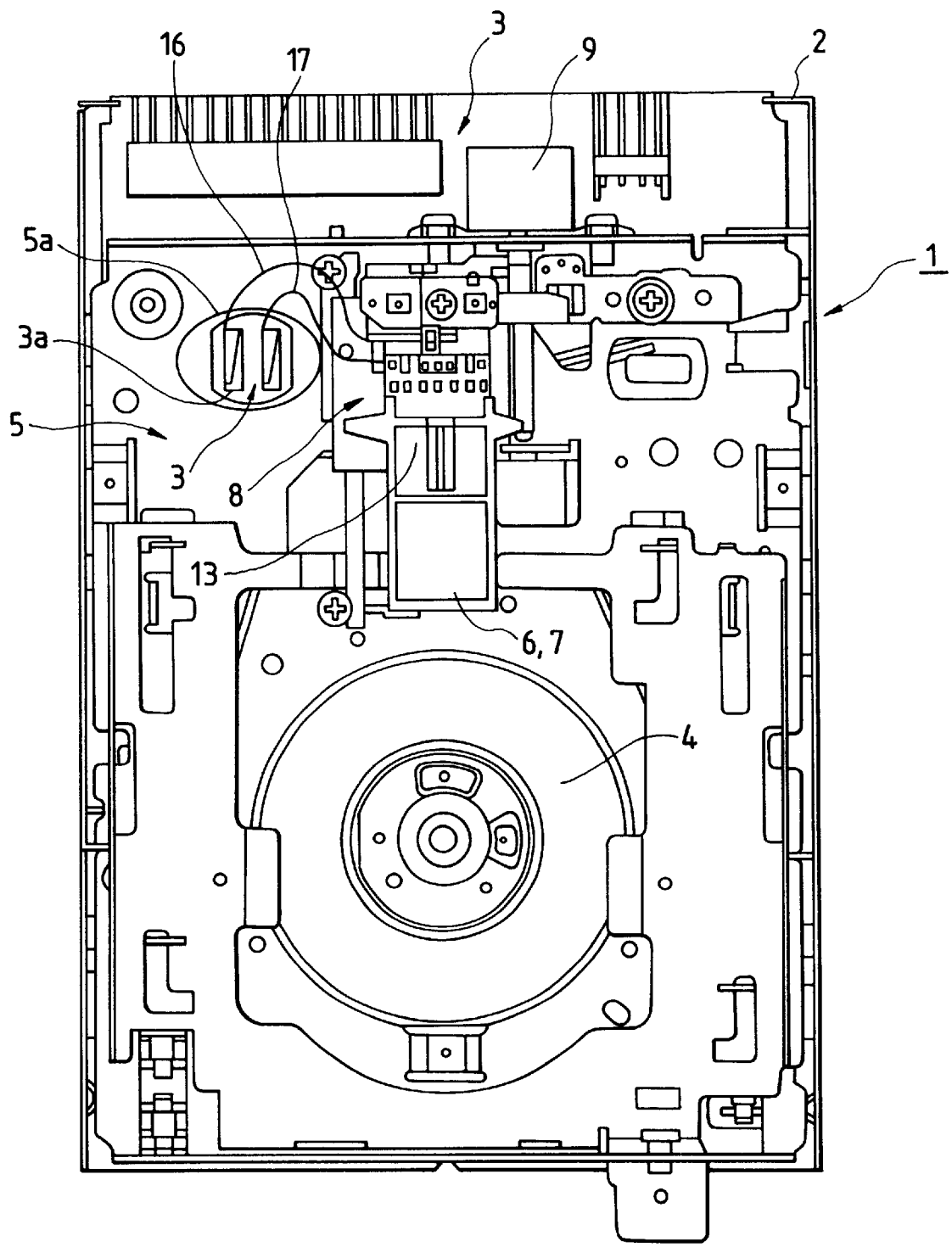
FIG. 1 is a plan view of a recording and reproducing device according to the present invention.
Figure 2:
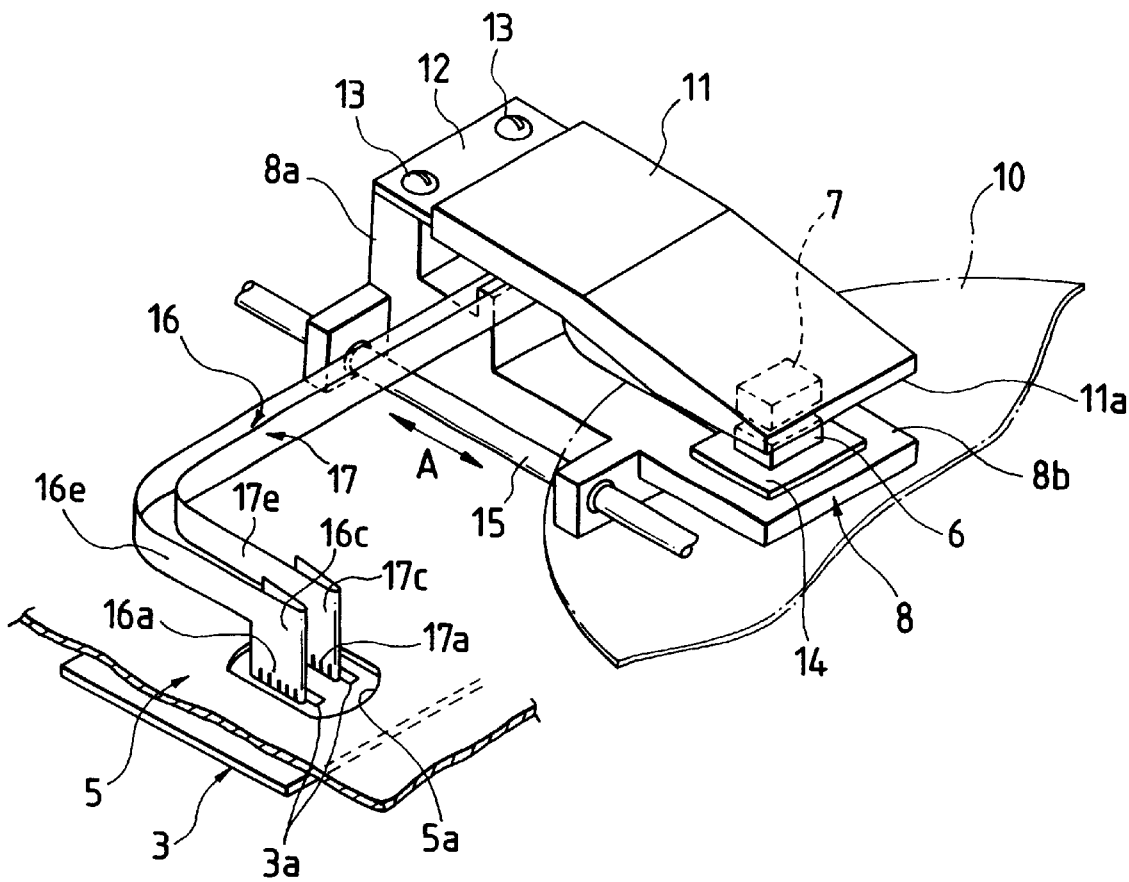
FIG. 2 is a partially expanded perspective view showing main components of the recording and reproducing device.
Figure 3:
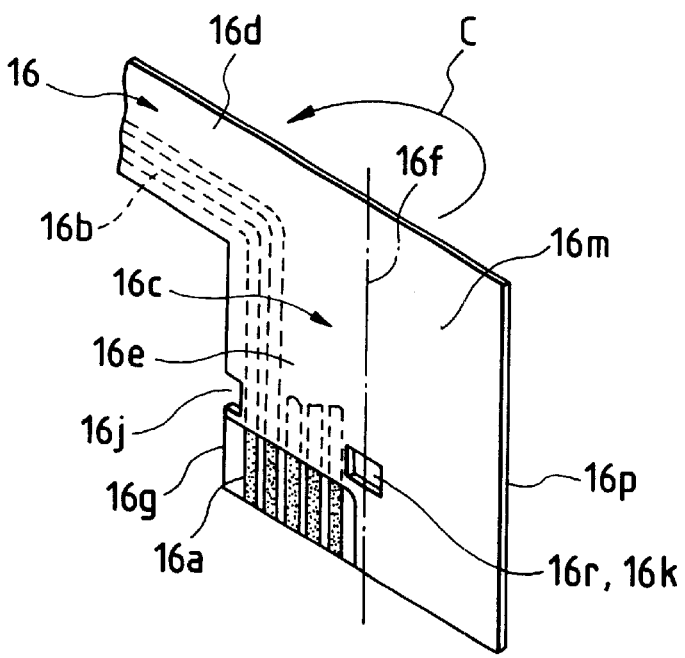
FIG. 3 is a perspective view of a flexible printed circuit board according to the present invention.
Figure 11:
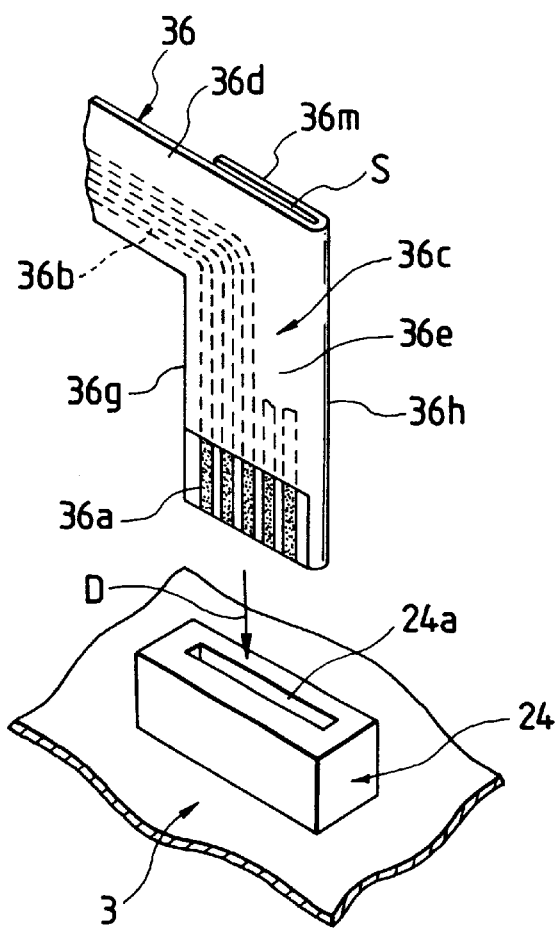
FIG. 11 is a perspective view of the flexible printed circuit board attachment structure according to another embodiment of the present invention.
Figure 12:
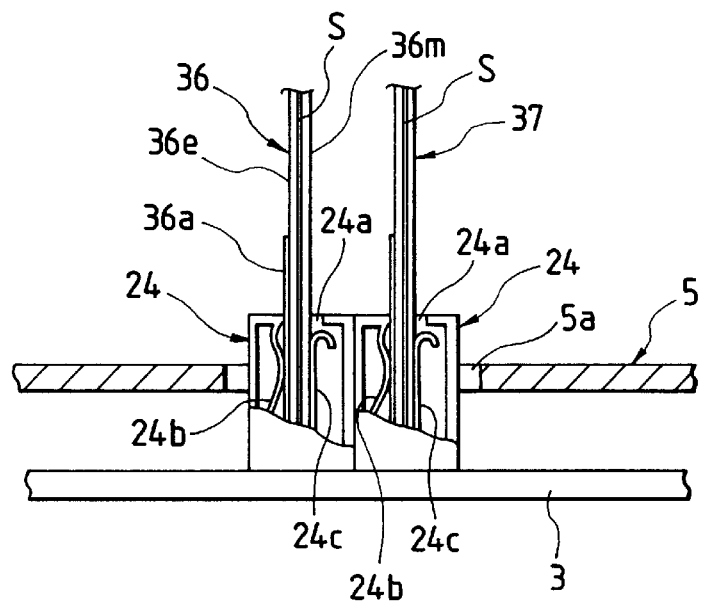
FIG. 12 is a partial cross sectional view of the flexible printed circuit board attachment structure according to another embodiment of the present invention.
Figure 13:
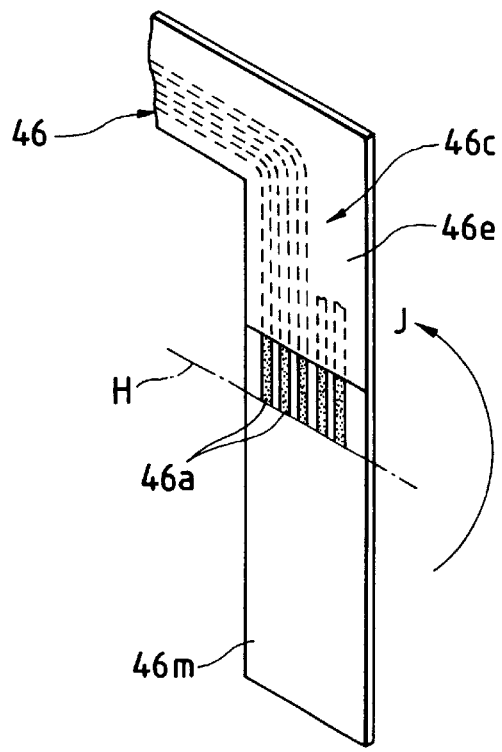
FIG. 13 is a perspective view of the flexible printed circuit board according to another embodiment of the present invention.
Figure 14:
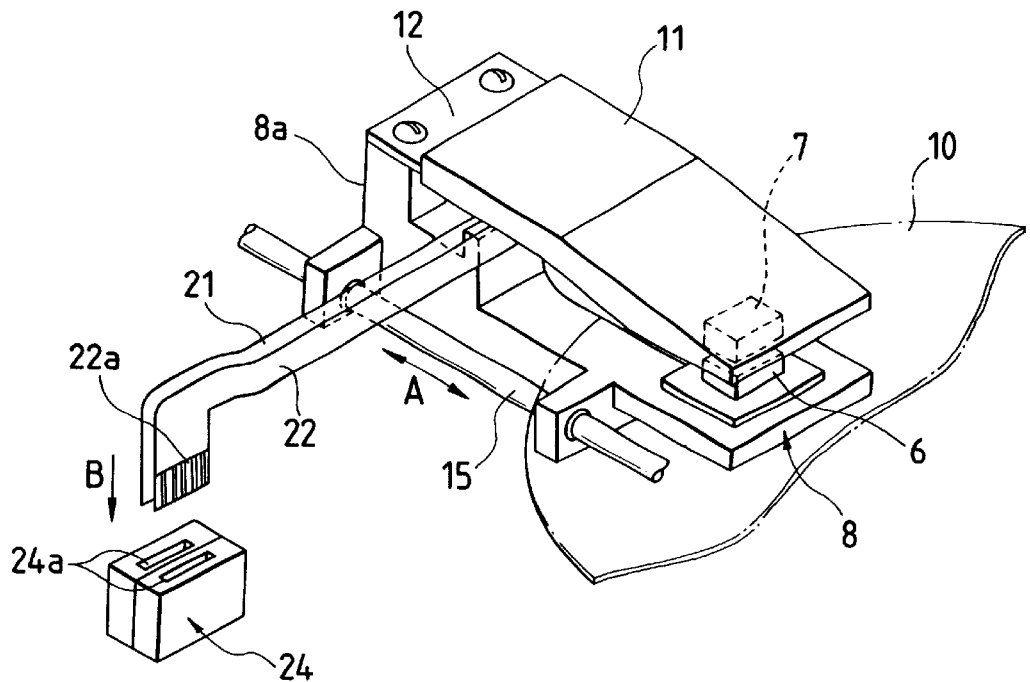
FIG. 14 is a partially expanded view showing main components of the conventional recording and reproducing device.
Figure 15:
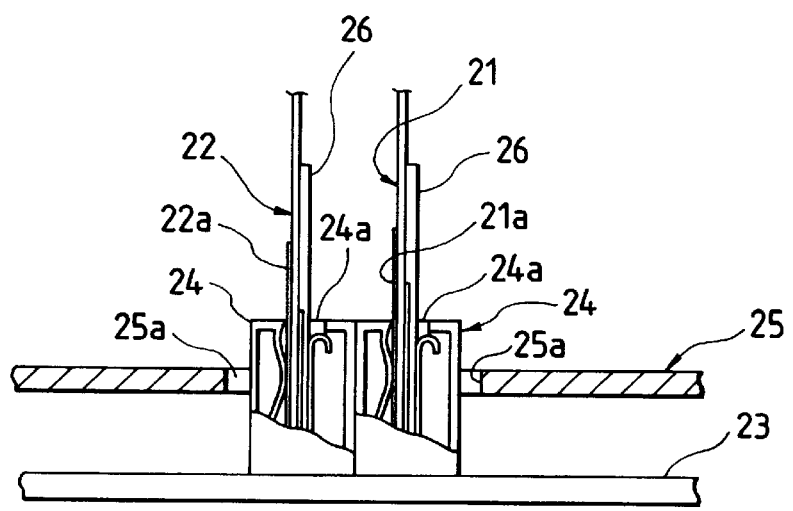
FIG. 15 is a partial cross sectional view of the conventional flexible printed circuit board attachment structure.
Figure 16:
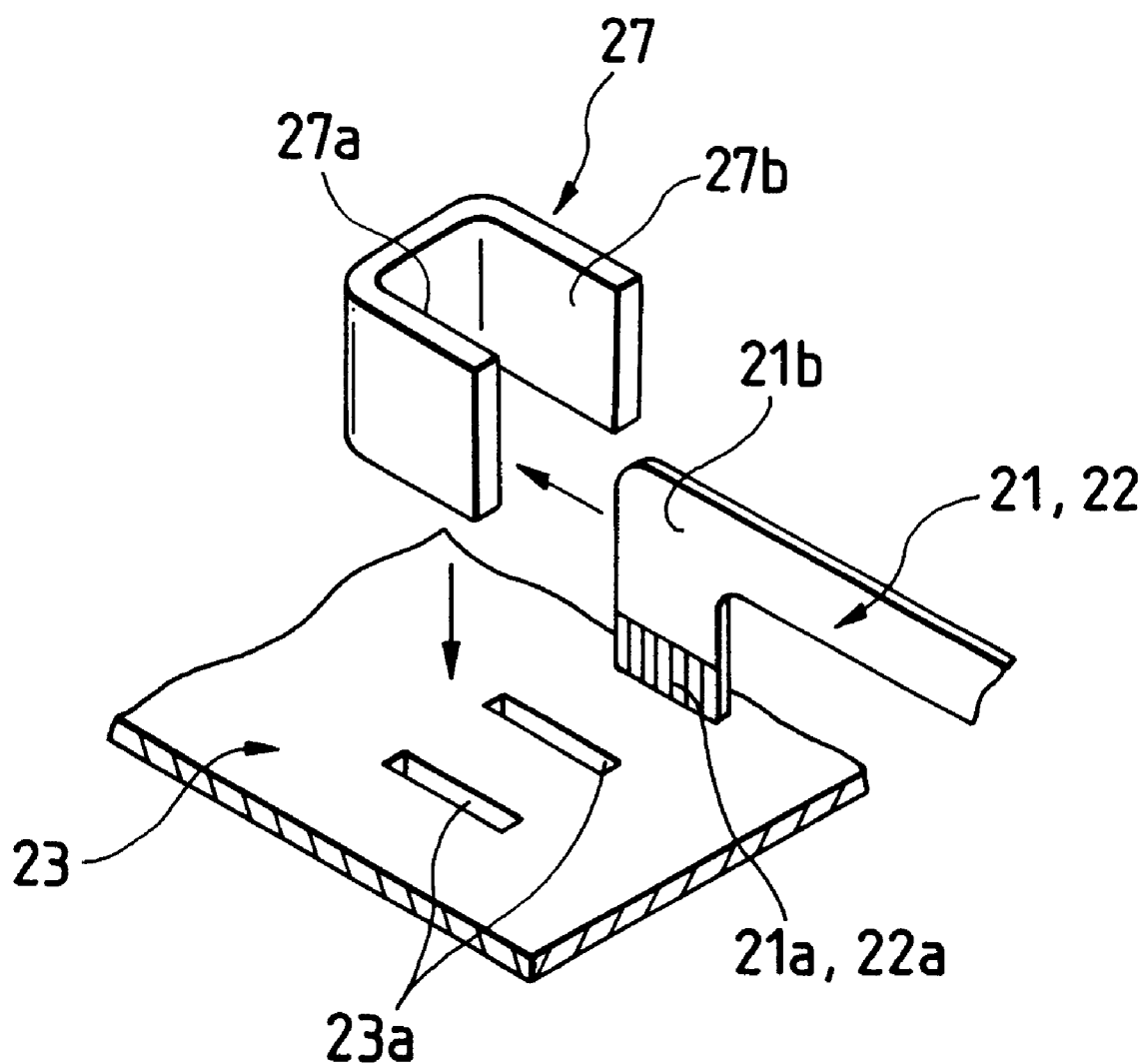
FIG. 16 is a perspective view showing a modification of the conventional flexible printed circuit board attachment structure.

FIG. 1 is a plan view of the device according to the present invention. FIG. 2 is a partially expanded perspective view of the device. FIG. 3 is a perspective view of an FPC according to the present invention. FIGS. 4 to 7 are schematic views explaining an FPC attachment structure according to the present invention. FIGS. 8A, 8B, 9A, 9B and 10 are schematic views explaining modifications of the present invention. FIGS. 11 to 13 are schematic views explaining other embodiments of the present invention.

Note that elements corresponding to those in the above-described conventional art have the same reference numerals.

In a case where the device according to the present invention is a magnetic recording and reproducing device using a recording disk such as a floppy disk, a device 1 in FIG. 1 comprises a main chassis 2 with its upper part open, a printed circuit board 3 of comparatively hard material such as phenol resin, having a wiring pattern (not shown) on its surface, attached to the main chassis 2, and a subchassis 5 provided above the printed circuit board 3. A turn table 4, for holding a recording disk 10 to be described later and rotating the disk 10, is rotatably attached to the subchassis 5.

The subchassis 5 has an approximately elliptic through hole 5a. Terminal formation portions 16c and 17c of FPC's 16 and 17 to be described later are inserted through the through hole 5a. A carriage 8, to which a pair of recording heads 6 and 7 of magnetic heads are attached, is provided in the central position of the subchassis 5.

Further, a stepping motor 9 for reciprocating the carriage 8 in arrow A directions to reciprocate the pair of recording heads 6 and 7 along a radial direction of the recording disk 10 represented by an alternate long and short dashed line, is attached to the subchassis 5.

As shown in FIG. 2, a head attachment base 8a is provided on the lower side of the carriage 8, and a head support arm 11 is rotatably attached to the upper side of the carriage 8 via a plate spring 12 with a plurality of screws 13 or the like.

The pair of recording heads 6 and 7, opposed in a vertical direction, are attached, respectively via a plate 14, to surfaces 8b and 11a opposed in the vertical direction at the end of the head attachment base 8a and the head support arm 11, respectively.

The pair of recording heads 6 and 7, in a state where they are in contact with the front and rear surfaces of the recording disk 10 in FIG. 2, reciprocate along the radial direction of the recording disk 10, by the moving operation of the carriage 8 in the arrow A directions, guided by a guide shaft 15, and driven by the stepping motor 9.

The pair of recording head 6 and 7 are moved in the arrow A directions while the recording disk 10 attached to the turn table 4 is rotated at a high speed, to record/reproduce or erase information with respect to the front and rear surfaces of the recording disk 10.

The pair of recording heads 6 and 7 are connected to flexible film type FPC's 16 and 17 connected to the printed circuit board 3. Recording and reproducing signals and the like from a controller (not shown) attached to the printed circuit board 3 side are transmitted via the FPC's 16 and 17 to the pair of recording heads 6 and 7.

In the FPC attachment structure of the present invention used in the device 1 described above, the printed circuit board 3 has attachment holes 3a in which the terminal formation portions 16c and 17c of the FPC's 16 and 17 are inserted.

As the FPC's 16 and 17 have the same shape and structure, description will be made on the FPC 16 side and that on the FPC 17 side will be omitted.

As shown in FIG. 3, the FPC 16 has terminals 16a of copper foil of the like, formed by printing or the like, exposed on a lower end of one surface. Further, the FPC 16 has a circuit pattern 16b extended upward from the terminals 16a. A plastic film or the like is attached, by lamination process or the like, to an upper surface of the circuit pattern 16b. Thus, the surface of the circuit pattern 16b is covered and insulated by the film.

Further, the FPC 16 has a connection portion 16d extended from the terminal formation portion 16c. The circuit pattern 16b, for transmitting recording and reproducing signals and the like sent from the controller to the side of the recording heads 6 and 7, is extended on the connection portion 16d.

Figure 4:
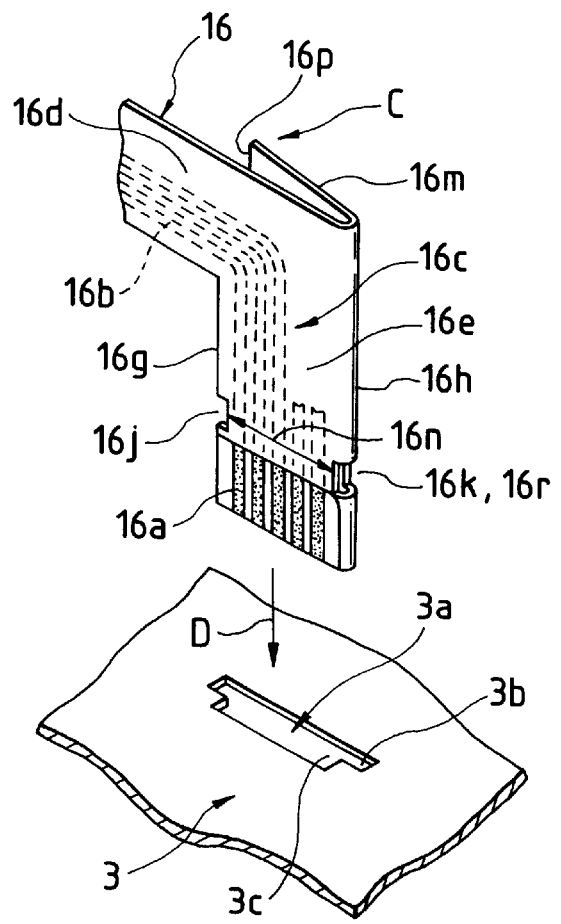
FIG. 4 is a perspective view of a flexible printed circuit board attachment structure according to the present invention.

As shown in FIGS. 3 and 4, the terminal formation portion 16c has a base portion 16e, from which the connection portion 16d is extended, and bend base portion 16h and bend portion 16m, bent from the base portion 16e along a bending line 16f in a direction of insertion (arrow D direction) into the attachment hole 3a of the printed circuit board 3.

The terminals 16a are formed on one surface of the base portion 16e, and the bend portion 16m is bent along the bending line 16f in an arrow C direction into a U shape, such that the base portion 16e and the bend portion 16m are adjacent to each other.

The base portion 16e bent from the bending line 16f and the bend portion 16m have approximately the same area size. As shown in FIG. 3, the base portion 16e functions as a terminal formation region where the plurality of terminals 16a are formed. The bend portion 16m functions as a terminal non-formation region where the terminals 16a are not formed.

The connection portion 16d extends from the upper end of the base portion 16e of the terminal formation portion 16c in an approximately horizontal direction. The terminal formation portion 16c comprising the base portion 16e and the bend portion 16m is inserted into the attachment hole 3a of the printed circuit board 3, thus attaching the FPC 16 to the printed circuit board 3.

As shown in FIG. 4, the attachment hole 3a of the printed circuit board 3 has an approximately T shape with a long hole 3b and a short hole 3c. Further, in the FPC 16, the base portion 16e of the terminal formation portion 16c after bending process has a notch 16k on the bend base portion 16h side and a notch 16j in an end surface 16g on the side opposite to the bend base portion 16h, and a narrow width portion 16n is formed between the pair of opposed notches 16j and 16k.

The notch 16k of the bend base portion 16h is formed by providing a rectangular hole 16r on the bending line 16f prior to bending process, as shown in FIG. 3, and bending the base portion 16e from the bending line 16f.

Figure 5:
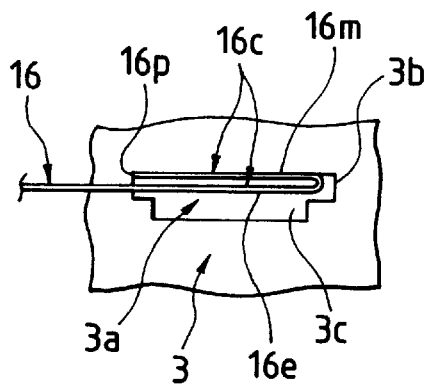
FIG. 5 is a partial plan view of the flexible printed circuit board attachment structure according to the present invention.

To attach the FPC 16 having the above structure to the attachment hole 3a, the bend portion 16m and the base portion 16e after bending process are bent with a load such that they come into close contact with each other, and inserted into the long hole 3b of the attachment hole 3a, as shown in FIG. 5.

Figure 6:
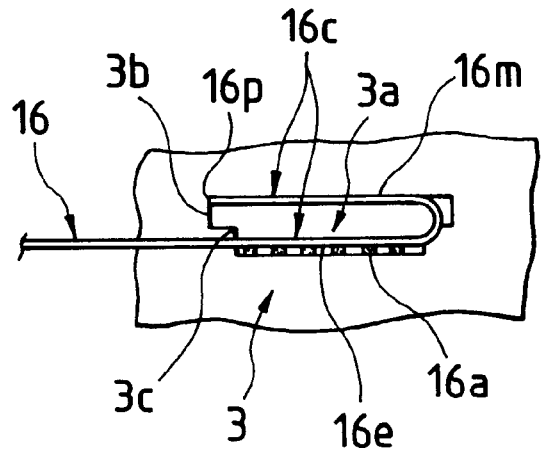
FIG. 6 is a partial plan view of the flexible printed circuit board attachment structure according to the present invention.

In a state where the notches 16j and 16k are positioned in the short hole 3c, the load on the base portion 16e and that on the bend portion 16m are removed. Then, the base portion 16e having the narrow width portion 16n moves to the short hole 3c side by spring-back by the flexible FPC 16, and the FPC 16 has an approximately U shape, as shown in FIG. 6.

Figure 7:
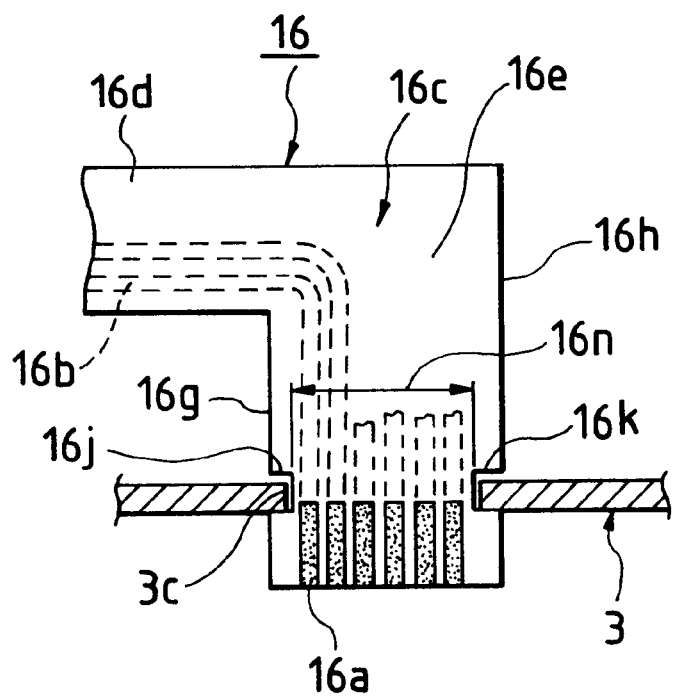
FIG. 7 is a cross sectional view of the flexible printed circuit board attachment structure according to the present invention.

As shown in FIG. 7, the narrow width portion 16n of the FPC 16 is positioned in the short hole 3c, and the notches 16j and 16k prevent removal of the FPC 16 from the printed circuit board 3.

In the description of the FPC attachment structure of the present invention, the pair of notches 16j and 16k are formed on the bend base portion 16h and the end surface 16g respectively of the base portion 16e. However, it may be arranged such that the end surface 16g of the base portion 16e does not have the notch 16j but an end surface 16p of the bend portion 16m has a notch (not shown).

In this configuration, the positions of the long hole 3b and the short hole 3c are reversed, so that the terminal formation portion 16c is prevented from being removed from the printed circuit board 3.

In the present embodiment, the attachment hole 3a has a T shape comprising the long hole 3b and the short hole 3c, and in the base portion 16e or the bend portion 16m of the FPC 16, notches 16j and 16k are provided on the bend base portion 16h and the end surface 16g on the side opposite to the bend base portion 16h, to form the narrow width portion 16n. The terminal formation portion 16c of the FPC 16 is prevented from being removed from the attachment hole 3a by inserting the narrow width portion 16n into the short hole 3c of the attachment hole 3a.

Further, as shown in FIG. 7, in the FPC 16 inserted into the attachment hole 3a and prevented from being removed from the hole, the terminals 16a are elastically contacted with the wiring pattern (not shown) formed on the lower surface side of the printed circuit board 3, and the terminals are connected to the pattern with solder (not shown) or the like, thus electrical conduction is established.

The base portion 16e has been described as a terminal formation region where the plurality of terminals 16a are formed, and the bend portion 16m has been described as a terminal non-formation region where the terminals 16a are not formed. Further, it may be arranged such that the terminals 16a are exposed on the outer surfaces of the base portion 16e and the bend portion 16m.

In this case, the bent terminal formation portion 16c, inserted into the attachment hole 3a, has an approximately U shape such that the terminals 16a exposed on the outside are in contact with the inner surface of the attachment hole 3a without a gap. Thus, solderability can be improved.

Figure 8A:
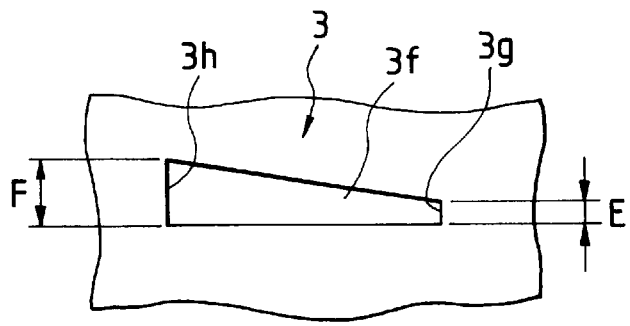
FIGS. 8A and 8B are schematic plan views showing modifications of an attachment hole for the flexible printed circuit board according to the present invention.
Figure 8B:
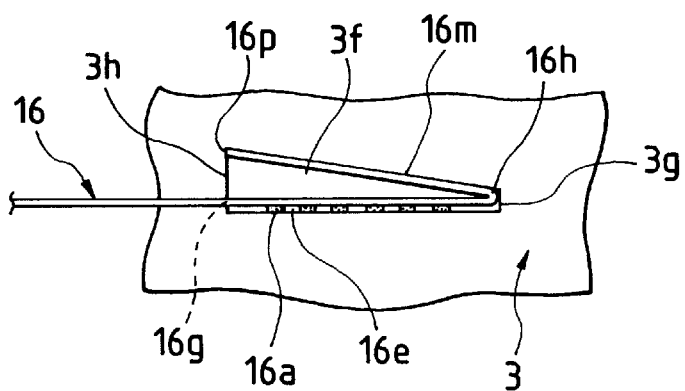
Figure 9A:
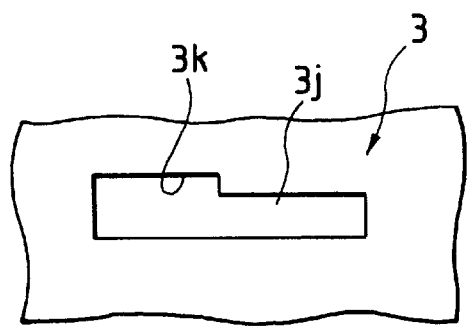
FIGS. 9A and 9B are schematic plan views showing modifications of the attachment hole for the flexible printed circuit board according to the present invention.
Figure 9B:
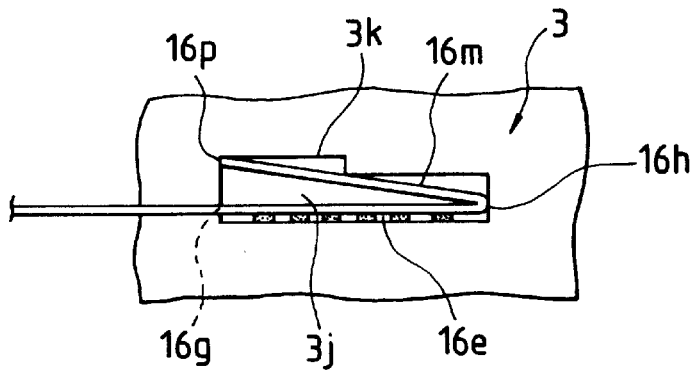

Further, as shown in FIGS. 8A and 8B, as another embodiment of the attachment hole 3a having the T shape, formed in the printed circuit board 3, an attachment hole 3f having an approximately trapezoidal shape can be provided. The attachment hole 3f has a narrow width side having a width E, where the bend base portion 16h of the FPC 16 is positioned, and a wide width side having a width F, where the end surfaces 16g and 16p on the side opposite to the bend base portion 16h are positioned. In this case, even if the bend base portion 16h does not restore the U shape as shown in FIG. 6 but has a V shape, the plurality of terminals 16a formed on the base portion 16e can be brought into contact with the inner surface of the attachment hole 3f without a gap. Accordingly, the solderability of the terminals 16a can be improved.

Further, as a modification of the attachment hole 3f as described above, as shown in FIGS. 9A and 9B, it may be arranged such that a step-shaped inner surface 3k with which the bend portion 16m of the FPC 16 comes into contact is formed, and one side where the bend base portion 16h of the FPC 16 is positioned has a narrow width, while another side where the end surfaces 16g and 16p on the side opposite to the bend base portion 16h are positioned has a wide width.

Further, in the above embodiment, the spring-back of the base portion 16e and the bend portion 16m after bending process is utilized to attach the FPC to the attachment hole 3a of the printed circuit board 3.

Figure 10:
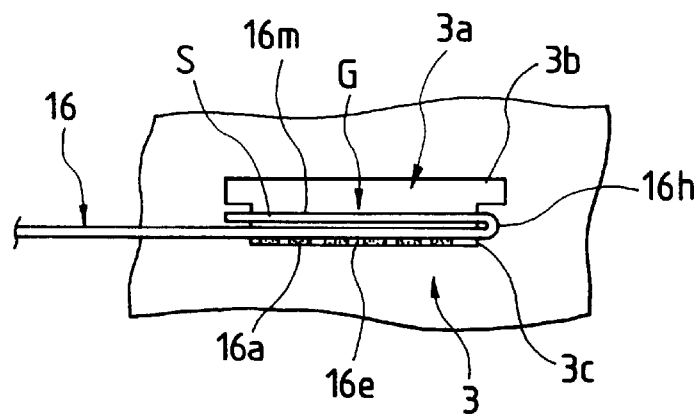
FIG. 10 is a partial plan view showing a modification of the flexible printed circuit board attachment structure according to the present invention.

However, as shown in FIG. 10, it may be arranged such that the bend portion 16m and the base portion 16e are attached to each other via adhesive S such as a double-faced adhesive tape, and the attached bend portion 16m and the bend base 16e are pressed in an arrow G direction, to bring the terminals 16a on the base portion 16e into contact with the inner surface on one side of the short hole 3c of the attachment hole 3a.

Further, as another embodiment of the present invention, the connectors 24 described in the conventional art can be employed. In this case, as shown in FIG. 12, two connectors 24 are attached to the printed circuit board 3, and the connectors 24 are projected from the through holes 5a of the subchassis 5.

The connectors 24 respectively have a connecting portion 24a having an opening in its upper part. The connecting portion 24a includes connection terminals 24b and an elastic contact piece 24c.

Terminal formation portions 36c and 37c of FPC's 36 and 37 are inserted into the connecting portions 24a.

As shown in FIG. 11, the FPC 36 (the FPC 37 has the same structure as that of the FPC 36, therefore, description will be made only on the FPC 36 side) has terminals 36a formed by printing or the like, exposed on a lower end of its one surface, and a circuit pattern 16b extended upward from the terminals 36a and covered with a film, thus constructing the terminal formation portion 36c.

Further, a connection portion 36d where the circuit pattern 36b is formed extends from the terminal formation portion 36c.

The terminal formation portion 36c has a base portion 36e, as one surface where the connection portion 36d is extended, and a bend base portion 36h and a bend portion 36m as shown in FIG. 11, bent from the base portion 36e along a bending line (not shown) in a direction of insertion (arrow D direction) into the connecting portion 24a of the connector 24.

The base portion 36e and the bend portion 36m are formed to have approximately the same area size. A double-faced adhesive tape or the like, as the adhesive S, is attached to the rear surface of the terminal formation portion 36c comprising the base portion 36e and the bend portion 36m.

Accordingly, as shown in FIG. 11, the base portion 36e and the bend portion 36m after bending process are attached to each other via the adhesive S, thus increasing the strength of the terminal formation portion 36c and preventing the terminal formation portion 36c from falling.

The base portion 36e and the bend portion 36m attached to each other with the adhesive S are parallel to each other via the adhesive S such that the portion of the terminals 36a has a thickness of about 0.3 mm. Accordingly, as shown in FIG. 12, in the portion of the terminals 36a of the FPC 36 inserted into the connecting portion 24a, the bend portion 36m side is reliably contacted with the connection terminals 24b by an elastic force of the elastic contact piece 24c. Thus, electrical conduction can be established between the terminals 36a and the connection terminals 24b.

Further, as another modification of the FPC of the present invention, as shown in FIG. 13, an FPC 46 has a terminal formation portion 46c comprising a base portion 46e where terminals 46a are formed and a bend portion 46m extended downward from the base portion 46e.

The bend portion 46m is bent along a bending line H in a direction orthogonal to the direction of insertion into the connecting portion 24a of the connector 24, upward in an arrow J direction, and attached to the base portion with the adhesive S.

In the device 1 having the FPC attachment structure of the present invention as described above, as shown in FIG. 2, the terminal formation portion 16c attached to the attachment hole 3a is parallel to the moving directions (arrow A directions) of the recording heads 6 and 7 on the side to which signals are transmitted.

Further, the device 1 has been described as a magnetic recording and reproducing device with recording heads 6 and 7 comprising magnetic heads, using the recording disk 10 such as a floppy disk. However, the device 1 is not limited to the magnetic recording and reproducing device, but it can be widely applied to various recording and reproducing devices including, e.g., an optical system recording and reproducing device.

The present invention is not limited to the above embodiments and various changes and modifications can be made within the spirit and scope of the present invention. Therefore, to appraise the public of the scope of the present invention, the following claims are made.

What is claimed is:

1. A flexible printed circuit board attachment structure comprising:

a printed circuit board having an attachment hole disposed in a plane thereof; and a flexible printed circuit board having a terminal formation portion and a connection portion, where terminals are exposed on a surface of said terminal formation portion near an insertion end thereof, and where a circuit pattern electrically connected to said terminals is extended from said terminal formation portion to a signal transmission side of said connection portion, wherein said terminal formation portion comprises a base portion extending from said connection portion to the insertion end of said terminal formation portion, and a bend portion connected to said base portion by a bend base portion, said bend base portion being formed along a bending line substantially parallel to a direction of insertion of said terminal formation portion into said attachment hole of said printed circuit board, such that said interior surface of said base portion faces an interior surface of said bend portion, said direction of insertion being substantially perpendicular to the plane of the printed circuit board, wherein said terminals are exposed on an outer surface of said base portion that does not face said bend portion, and wherein said bend portion and said base portion are inserted into and attached to said attachment hole.

2. The flexible printed circuit board attachment structure according to claim 1, wherein said terminals are exposed on an outer surface of said bend portion.

3. The flexible printed circuit board attachment structure according to claim 1, wherein said base portion is a terminal formation region where said terminals are formed, and said bend portion is a terminal non-formation region where said terminals are not formed.

4. The flexible printed circuit board attachment structure according to claim 1, wherein said attachment hole is formed so as to have a T shape comprising a long hole and a short hole, wherein the narrow width portion is inserted into said short hole so as to secure said terminal formation portion thereto.

5. The flexible printed circuit board attachment structure according to claim 1, wherein said attachment hole comprises a first side against which said bend base portion is positioned, said first side having a narrow width, and a second side against which an end surface of said base portion, which is on a side opposite to said bend base portion, is positioned, said second side having a wide width.

6. The flexible printed circuit board attachment structure according to claim 1, wherein the interior surfaces of said bend portion and said base portion are attached to each other by adhesive, and wherein said terminals are brought into contact with an inner surface of said attachment hole.

7. A recording and reproducing device using the flexible printed circuit board attachment structure in claim 1.

8. The recording and reproducing device according to claim 7, further comprising a recording head that performs recording/reproducing with respect to a recording disk, and wherein said flexible printed circuit board is electrically connected to said recording head.

9. The recording and reproducing device according to claim 8, wherein the base portion of said terminal formation portion of said flexible printed circuit board is disposed in a plane that is parallel to a moving direction of said recording head.

* * * * *